United States Patent [19]

Horng et al.

[11] 4,242,791
[45] Jan. 6, 1981

[54] HIGH PERFORMANCE BIPOLAR TRANSISTORS FABRICATED BY POST EMITTER BASE IMPLANTATION PROCESS

[75] Inventors: Cheng T. Horng, Fishkill; Harold V. Lillja, Peekskill; David K. Seto, LaGrangeville, all of N.Y.

[73] Assignee: International Business Machines Corporation, Armonk, N.Y.

[21] Appl. No.: 77,699

[22] Filed: Sep. 21, 1979

[51] Int. Cl.³ ................................................ B01J 17/00
[52] U.S. Cl. ........................................ 29/578; 29/580; 29/591; 204/15; 357/91
[58] Field of Search .................... 29/578, 580, 591; 357/91; 204/15

[56] References Cited

U.S. PATENT DOCUMENTS 3,595,716  7/1971  Kerr ...................................... 357/91

*Primary Examiner*—W. C. Tupman
*Attorney, Agent, or Firm*—Wesley DeBruin

[57] ABSTRACT

Disclosed is a method for fabricating very high performance semiconductor devices, particularly bipolar-type transistors having a heavily doped inactive base and a lightly doped narrow active base formed by ion implantation. In order to prevent the high dose boron implantation, for an NPN transistor, from getting into the active base region, a self-aligned mask covering the emitter contact i.e., active base region, is required for inactive base implantation. The self-aligned mask is anodically oxidized aluminum pads. The device wafer metallized with blanket aluminum film is immersed in a dilute $H_2SO_4$ solution electrolytic cell which selectively anodizes only the aluminum lands situated over the $Si_3N_4/SiO_2$ defined device contact windows. The aluminum oxide formed by anodization process is porous but may be sealed and densified. The aluminum film that is not anodized is then selectively etched off using either chemical solution or sputter etching. Using the aluminum oxide formed over the contact windows to mask the active base region, a high dose boron implantation is made through the $Si_3N_4/SiO_2$ layers to dope the external base region. After stripping the aluminum oxide from the emitter contact window, the emitter with a desired concentration profile and junction depth is subsequently formed. Formation of the active base is formed by a low dose boron implantation made with its concentration peak below the emitter. A relatively low temperature annealing, as for example, 900° C., is used to fully activate the implanted boron and minimize the redistribution of the active base doping profile. The device thus formed will have a controllable narrow base width and doping profile.

10 Claims, 12 Drawing Figures

HIGH PERFORMANCE BIPOLAR TRANSISTORS FABRICATED BY POST EMITTER BASE IMPLANTATION PROCESS

FIELD OF THE INVENTION

This invention relates mainly to bipolar transistor devices, their structure and preparation, and more particularly to the fabrication of very high performance transistors having controllable narrow base width and low external base resistance.

BACKGROUND OF THE INVENTION AND PRIOR ART

Reference is made to U.S. Pat. No. 3,986,897 entitled "Aluminum Treatment to Prevent Hillocking" granted Oct. 19, 1976 to L. D. McMillan et al. The McMillan et al patent discloses a method of surface treating aluminum, particularly aluminum metallization for semiconductors, which includes subjecting the aluminum surface to be treated with fuming nitric acid for one to ten minutes at room temperature. Following cleaning, the surface is subjected to boiling water for 5 to 15 minutes. The foregoing treatment appears to form a boehmite (AlO(OH)) layer on the surface of the aluminum, thereby substantially eliminating hillocking.

Reference is made to U.S. Pat. No. 4,068,018 entitled "Process for Preparing a Mask for Use In Manufacturing A Semiconductor Device" granted Jan. 10, 1978 to T. Hashimoto et al. The Hashimoto et al patent discloses a process for preparing a mask, such as a photomask, used in a selective etching process in the manufacture of a semiconductor device or a protective mask for use in a process for selectively providing a porous layer of silicon or for anodic oxidation of a metal layer, in which ions accelerated at a predetermined voltage are implanted into a photo-resist film to a predetermined dose level.

Reference is made to U.S. Pat. No. 4,089,709 entitled "Method for Passivating Aluminum Layers on Semiconductive Devices" granted May 16, 1978 to J. M. Harris. The Harris patent discloses an aluminum layer such as an intraconnect on an integrated circuit semiconductive device is passivated by oxidizing the aluminum layer to form a thin layer of amorphous alumina thereon. The alumina layer is coated with a surface active agent to form a hydrophobic surface on the aluminum oxide to inhibit the creation and growth of ALOOH on the oxide layer. The hydrophobic surface is coated with a conventional passivating material such as silicon dioxide, epoxy or the like.

Reference is made to U.S. Pat. No. 4,118,250 entitled "Process For Producing Integrated Circuit Devices by Ion Implantation" granted Oct. 3, 1978 to C. T. Horng et al. The Horng et al patent discloses a process of producing a bipolar transistor where all the regions of the device except the emitter region are formed by ion implantation through an inorganic dielectric layer of uniform thickness. Subsequently, all the contact openings to the emitter, base and collector are formed and the emitter is implanted through the emitter contact opening. This unique combination of process steps permits the use of a surface insulating dielectric layer of uniform thickness, wherein all capacitances are uniform and controllable while still permitting direct implantation of the emitter, which, because of its shallow depth is difficult to implant through an oxide.

Reference is made to the anodization process disclosed and schematically illustrated in FIG. 1 of the publication entitled "Identification of Crystal Defects Causing Diffusion Pipes" by D. K. Seto, F. Barson and B. F. Duncan in Semiconductor Silicon 1973, H. R. Huff and R. R. Burgess, Ed., The Electrochemical Society Softbound Symposium Series, 1973, pp. 651–657.

Reference is made to the publication "Anodic Oxide Films on Aluminum" by J. W. Diggle, et al. Chemical Reviews Vol. 69, 1969 pages 365–405.

In the prior art so called "double-diffused" bipolar transistor, a base region is formed by a selective diffusion into a collector region and an emitter extending only partially in the base region is formed by a second diffusion. The emitter diffusion in most applications is done at a temperature considerably higher than that for the base diffusion. This high temperature diffusion cycle redistributes the base doping profile previously formed by the base diffusion.

For a vertical bipolar transistor the part of the base region situated directly below the emitter is the active base region. The impurity doping profile and the width of the active base determines the emitter injection efficiency, current gain and device speed. The base region that surrounds the emitter is the inactive base. The metal to base contact is formed over the inactive base region. The doping in the inactive base region determines the emitter-base breakdown characteristics and the external base resistance.

For good high frequency response it is important that the base width is narrow and the active base region is lightly doped. It is also important that the inactive base is heavily doped to lower the base series resistance and metal-base contact resistance.

In the conventional double-diffused bipolar transistor, as the device depth is reduced to improve the device speed performance, control of the integrated base doping in the active base region while maintaining a low sheet resistance in the external base region becomes increasingly difficult. In order to obtain an improved transistor structure, the impurity doping profiles in the active base and the inactive base have to be controlled by separate, independently processes. To achieve a controllable narrow base width it is desirable that the active base be formed "in place". To accomplish the above mentioned goals it is necessary that ion-implantation instead of the conventional thermal diffusion process be used for doping the inactive and active base.

Ion-implantation provides a means for precisely controlling the total amount of impurity transferred to the wafer. The impurity depth distribution is accurately controlled by implant energy. Unlike the conventional thermal diffusion process, ion implantation is not a high temperature process. Implantation into the silicon can be made through the surface passivation layer. Thus, by using photoresist or metal maskings, different impurity introductions into the semiconductor can be achieved without resort to various high temperature diffusions. A final thermal heat-treating is sufficient to anneal out the radiation damage caused by implantations and obtain the desired device junction depth. Consequently, integrated circuit devices can be made shallower, with greater precision on the impurity distribution using ion-implantation technology.

SUMMARY OF THE INVENTION

It is, therefore, an object of this invention to provide a method for fabricating a very high performance semiconductor device, particularly a bipolar-type transistor having a heavily doped inactive base and a lightly doped narrow active base formed by ion implantation.

In order to prevent the high dose boron implantation, for an NPN transistor, from getting into the active base region, a self-aligned mask covering the emitter contact i.e., active base region, is required for inactive base implantation. The self-aligned mask to be used in this disclosed process is the anodically oxidized aluminum pads. In this invention process, the device wafer metallized with blanket aluminum film is immersed in a dilute $H_2SO_4$ solution electrolytic cell which selectively anodizes only the aluminum lands situated over the $Si_3N_4$/$SiO_2$ defined device contact windows. The aluminum oxide formed by anodization process is porous but can be sealed and densified. The aluminum film that is not anodized is then selectively etched off using either chemical solution or sputter etching. Using the aluminum oxide formed over the contact windows to mask the active base regions, a high dose boron implantation is made through the $Si_3N_4/SiO_3$ layers to dope the inactive base region. After stripping the aluminum oxide from the emitter contact window, emitter with a desired concentration profile and junction depth is subsequently formed. Formation of the active base is formed by a low dose boron implantation made with its concentration peak below the emitter. A relatively low temperature annealing, as for example, 900° C., is used to fully activate the implanted boron and minimize the redistribution of the active base doping profile. The device thus formed will have a controllable narrow base width and doping profile.

DESCRIPTION OF THE PREFERRED EMBODIMENTS

Figure 1:
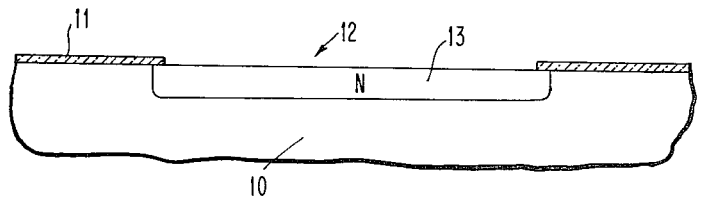
FIGS. 1 through 12 are elevational views in broken section illustrating the device structure at successive stages of the process in accordance with the invention.

Referring now to the figures of the drawings, and FIG. 1 in particular, a monocrystalline silicon wafer 10 is oxidized forming a masking layer 11. A diffusion window 12 for forming the subcollector is made in the layer 11 using standard photolithographic and substractive etching techniques. An N-type impurity is then introduced into wafer 10 forming the subcollector region 13. The impurity can be any suitable N-type impurity, as for example arsenic, and can be introduced into the wafer by any suitable technique as for example, capsule diffusion or ion implantation.

Figure 2:
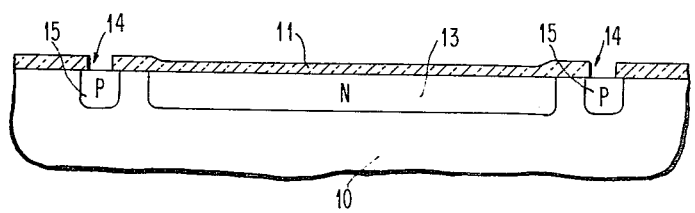

As shown in FIG. 2 the surface is re-oxidized reforming the masking layer over the subcollector 13. Diffusion windows 14 are made for the annular subisolation region by standard photolithographic and subtractive etching techniques and a P-type impurity introduced to form the subisolation region 15. The impurity preferably is boron introduced by capsule diffusion or BBr3 diffusion.

Figure 3:
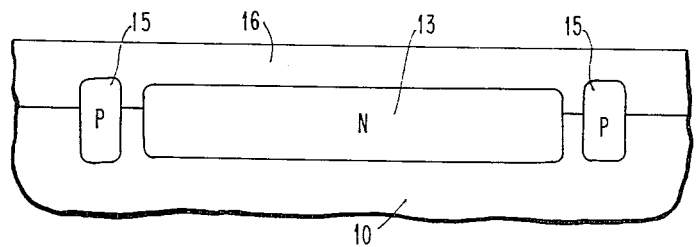

As shown in FIG. 3 the masking layer 11 is removed and an epitaxial silicon layer 16 deposited on the surface of wafer 10. During the epitaxial deposition process, which is a high temperature process, the subcollector region 13 and the subisolation region 15 diffuses upwardly into the layer 16.

Figure 4:
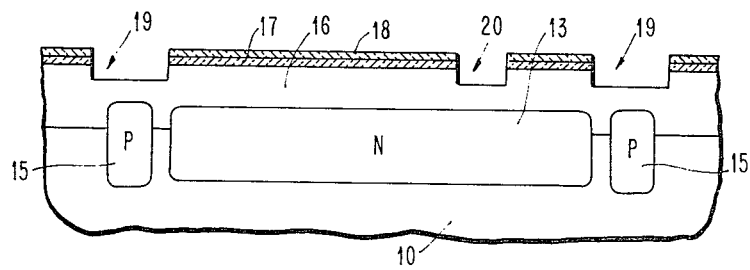

As shown in FIG. 4, the surface of the epitaxial layer 16 is oxidized in a suitable oxidizing atmosphere, as for example steam at 950° C., forming thermal oxide layer 17. A layer 18 of $Si_3N_4$ is subsequently deposited over layer 17 by conventional chemical vapor deposition (CVD) techniques that are well known in the industry. $Si_3N_4$ layer 18 will serve as a mask to prevent oxidation of the underlying regions of the epitaxial layer during formation of the recessed oxidation isolation region which will be described hereafter. A layer of photoresist not shown is then deposited over the layer of CVD $Si_3N_4$. The resist is then exposed, developed to form windows which overlie the subisolation region 15. A second opening is also made which will result in an oxide region which separates the base region from the collector reach-through region. Using photoresist as an etch mask, the exposed areas of the underlying $Si_3N_4$ and $SiO_2$ layers are removed by reactive ion etching technique resulting in openings 19 which overlie the subisolation region 15 and opening 20 which overlies the region which will separate the collector reach-through region from the base region of the transistor device. Subsequently, a portion of the epitaxial layer 16, that is exposed through windows 19 and 20 is removed by subtractive etching or reactive ion etching to a depth approximately ½ the depth that the recessed oxide region will extend into the epitaxial layer.

Figure 5:
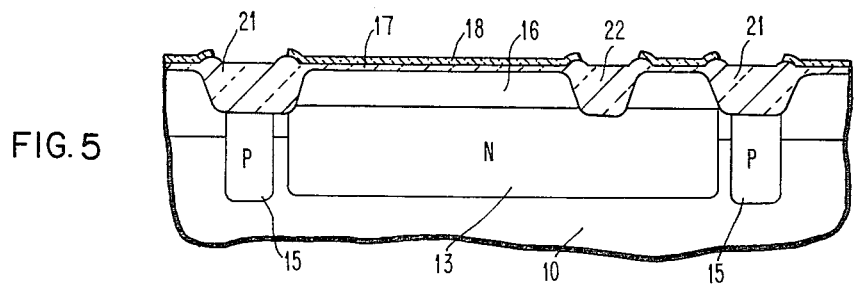

As shown in FIG. 5, the device is then exposed to an oxidizing atmosphere which results in the formation of the recessed oxide regions 21 on top of the subisolation region 15 and region 22 separating the collector reach-through region from the base region. The oxidizing atmosphere is typically steam heated at 1000° C.

Figure 6:
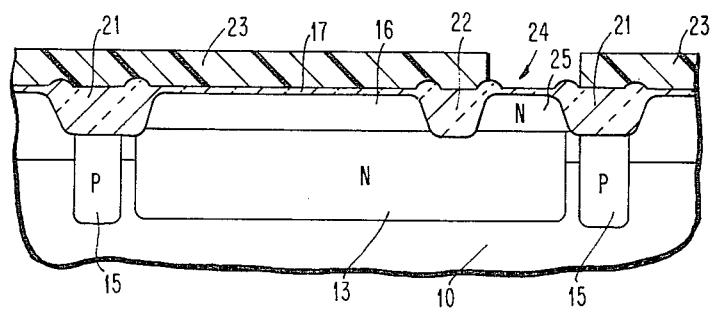

As shown in FIG. 6 the $Si_3N_4$ layer 18 is removed and a layer of photoresist 23 deposited on the surface of the device. The resist layer 23 is exposed and developed to form an opening 24 which overlies the collector reach-through region. A suitable N-type impurity, preferably phosphorus, is implanted into the epitaxial layer 16 to form collector reach-through 25. Preferably phosphorus implantation is done at a high energy, as for example, 400 KeV, so as to make good reach-through to the underlying subcollector 13. Resist layer 23 is then removed by using $O_2$ plasma.

Figure 7:
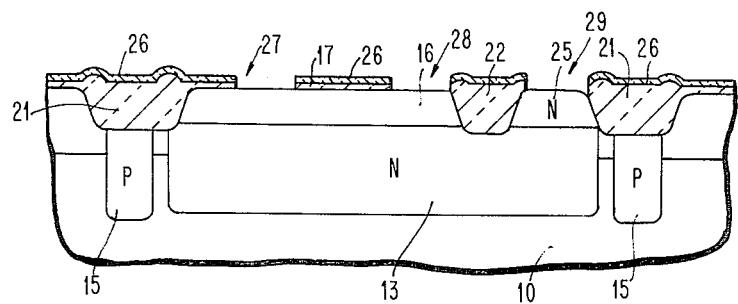

As indicated in FIG. 7 a layer 26 of $Si_3N_4$ is deposited over the oxide layer 17. A layer of photoresist, not shown in the figure, is deposited over layer 26. The photoresist layer is exposed and developed to produce a window 27 for the emitter contact, a window 28 for the base contact, and a window 29 for the collector contact. The underlying exposed areas of layers 26 and 17 are removed preferably by reactive ion etching which forms contact windows with nearly vertical sidewall.

Figure 8:
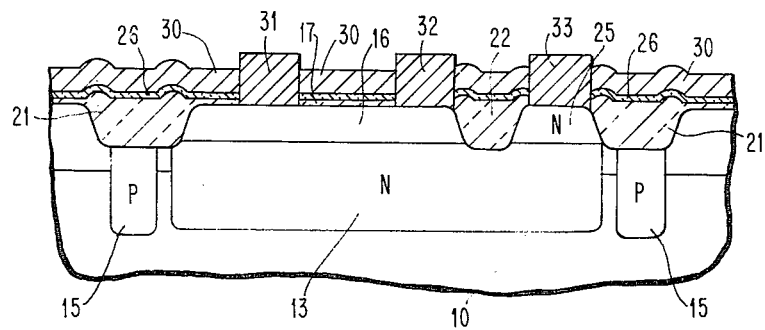

As shown in FIG. 8, a layer of aluminum film 30 is deposited over the wafer, preferably by using vacuum evaporation technique. The thickness of the evaporated aluminum film is about 1 μm. The wafer 10 is contacted from the back side and immersed in an electrolyte cell of a 5% $H_2SO_4$ solution to serve as an anode. A cathode of platinum plate can be used as the counter-electrode. The voltage applied for aluminum anodization is about 2.5 to 5.0 volts. The aluminum film 30 over the $Si_3N_4$ defined contact windows 27, 28 and 29 will be anodized to form aluminum oxide regions 31, 32 and 33. The aluminum oxide thus formed is porous but can be sealed and densified by immersing in boiling water or steam. The aluminum film that has not been anodized is then removed by using subtractive solution etching or by sputter etching.

Figure 9:
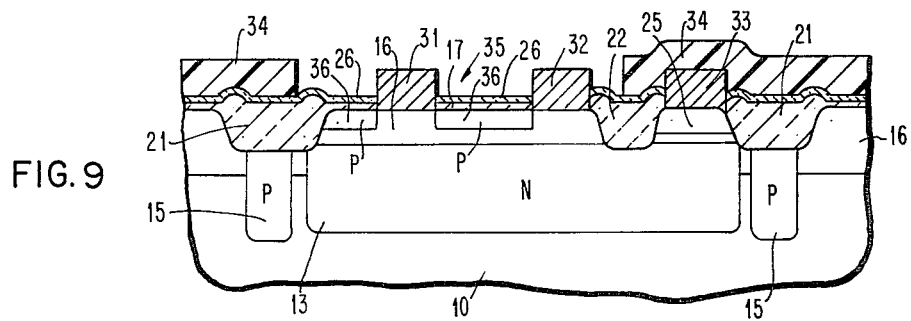

Refer to FIG. 9 a layer of photoresist 34 is deposited on the surface of device and subsequently exposed and developed to form a block-out window 35 to define the base area. A suitable P-type impurity preferably boron, is implanted through the Si$_3$N$_4$ 26 and SiO$_2$ 17 layers into the underlying epitaxial layer 16 to form external base 36 regions. The dose of boron implantation is around 2.0 to 2.5 × 10$^{14}$/cm$^2$ to produce an external base sheet resistance of about 400Ω/□. At this point in the process resistors (not shown) may be formed in different parts of the device. After boron implantation photoresist 34 and aluminum oxide 31, 32 and 33 on the contact regions are removed by using a warm H$_2$SO$_4$ solution.

Figure 10:
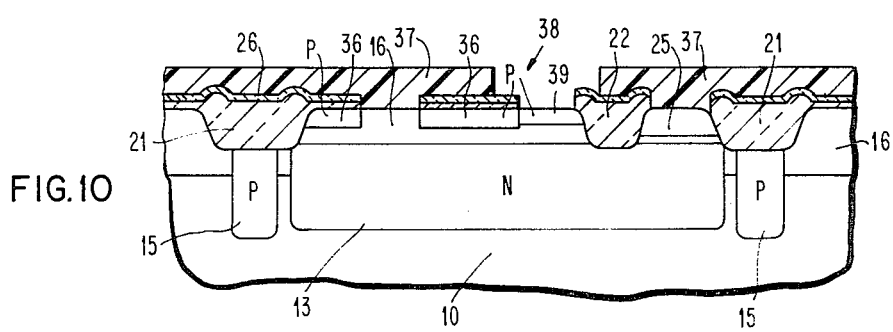

As shown in FIG. 10 a layer of photoresist 37 is deposited on the surface of device and then exposed and developed to leave a block-out window 38 which overlies the base contact 28. A suitable P-type impurity, preferably boron, is implanted through opening 38 to form base contact 39. The boron implantation can be made at low energy, approximately 30 to 40 keV, with a dose of around 1 to 2 × 10$^{14}$/cm$^2$. At this point of the process resistor contacts (not shown) may also be formed in different parts of the device. The masking photoresist is stripped.

Figure 11:
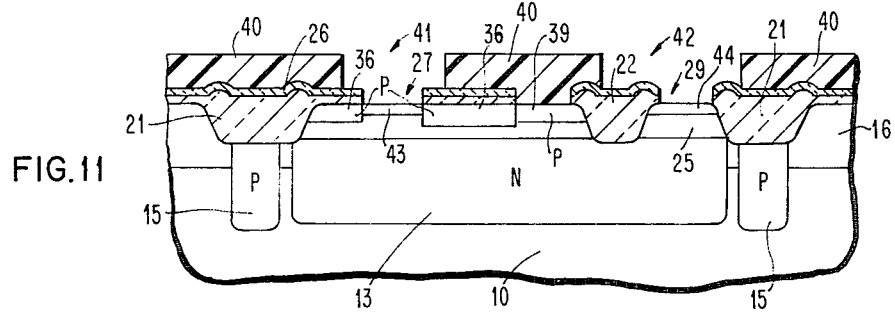

As indicated in FIG. 11 a layer of photoresist 40 is deposited and subsequently exposed and developed to leave exposed openings 41 and 42 which overlie the emitter and collector contact regions and block-off the base contact 39. A suitable N-type impurity, preferably arsenic is implanted through openings 27 and 29 forming emitter 43 and collector contact 44. The arsenic implantation is done at an energy on the order of 40 keV. The dose of arsenic implantation is around 2 to 5 × 10$^{15}$/cm$^2$. The resist layer 40 is removed and then device heated to activate the implanted impurities and to drive in the emitter 43, base regions 36 and 39 and collector region 44 into the epitaxial layer 16. The annealing operation allows the silicon lattice which has been damaged during the various ion implantation steps to regrow. The drive-in involves heating the device to a temperature in the range of 900° to 1100° C. preferably 1000° C. The time of the anneal depends on the dosage of the various implanted areas and the intended device junction depth. As indicated in FIG. 12 the emitter region 43 expands deeper into the device.

Figure 12:
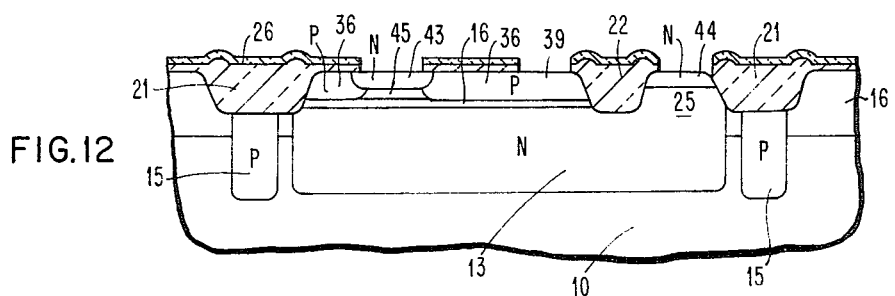

Referring now to FIG. 12, a photoresist layer (not shown) is deposited and subsequently exposed and developed to form a block-out window which overlies the emitter 43 region. The active base 45 of the transistor is then formed by a low dose boron implantation. The boron implantation is made into the epitaxial layer 16 with its concentration peak below the emitter 43, as for example, at an energy on the order of 40 to 50 keV with a dosage in the range of 0.5 to 2.0 × 10$^{13}$/cm$^2$. At this point in the process high value resistors, (not shown) in the range of 2000 to 4000Ω/□, can also be formed in the device structure. After implantation, the resist layer is stripped and the device is heated to 900° C. to activate the implanted boron. Annealing at 900° C. fully activates the implanted boron and causes very little redistribution of the doping profile.

The device illustrated in FIG. 12 is now ready for the deposition and fabricating of the metallurgy system which will interconnect the device shown with other devices, resistors, and the like on the same substrate 10 into electrical circuits. The forming of the metallurgy system is well known in the art and will not be discussed or described. It will be understood that the preferred embodiment illustrated and described in FIGS. 1 through 12 is an NPN transistor. It is understood that the conductivity types could be reversed, the impurities changed and other modifications made without departing from the spirit of the invention.

While the invention has been shown and particularly described with reference to a preferred embodiment, it will be understood by those skilled in the art that various changes in form and detail may be made without departing from the spirit and scope of the invention.

Having thus described our invention, what we claim as new, and desire to secure by Letters Patent is:

1. In a method for forming a bipolar transistor said method including the following steps:
  (a) forming a subcollector region of a first conductivity type in a monocrystalline semiconductor substrate of a second conductivity type;
  (b) forming an annular shaped isolation region in said substrate that at least encompasses said subcollector region;
  (c) depositing an epitaxial layer of semiconductor material on said substrate;
  (d) forming a silicon dioxide layer on said epitaxial layer;
  (e) forming a silicon nitride layer on said silicon dioxide layer;
  (f) opening an annular shaped trench in said exposed surface of said substrate, said trench having a depth less than the thickness of said epitaxial layer, said annular shaped trench being superimposed over said annular shaped isolation region and including a portion to be utilized in providing collector reach through isolation;
  (g) exposing said substrate to an oxidizing atmosphere to provide recessed silicon dioxide in said annular shaped trench and said portion utilized in providing collector reach through isolation;
  (h) remove the silicon nitride layer formed in step (e) supra;
  (i) implant impurities of a first conductivity type into a predetermined region of said epitaxial layer to provide collector reach-through;
  (j) form a silicon nitride layer over said exposed surface of said substrate;
  (k) open an emitter contact window, a base contact window and a collector contact window in said silicon nitride layer and underlying silicon dioxide to expose three regions on said epitaxial layer, said three regions on said epitaxial layer respectively corresponding to said emitter contact region, said base contact region and said collector contact region;
  (l) deposit a metal film over the exposed surface of the said substrate;
  (m) utilize the substrate as an anode in an electrolytic cell, whereby the metal film over said emitter contact region, said base contact region and said collector contact region are respectively anodized to form first, second and third metal oxide regions on the exposed surface of said substrate;
  (n) remove the unoxidized metal film whereby said first, second and third metal oxide regions remain on the surface of the substrate; and
  (o) additional steps further characterized in that said first metal oxide region is utilized to align the emitter and provide for post emitter ion implantation of the base.

2. In a method for forming a bipolar transistor, as recited in claim 1, where the deposited metal film is an aluminum film and the metal oxide is aluminum oxide.

3. In a method for forming a bipolar transistor, as recited in claim 1, wherein the first conductivity type monocrystalline semiconductor material is P-type material and said formed bipolar transistor is a PNP.

4. In a method for forming a bipolar transistor in a monocrystalline semiconductor substrate, said method including the following steps:
   (a) forming a subcollector region 13 (FIG. 1) of a first conductivity type in a monocrystalline semiconductor substrate 10 of a second conductivity type;
   (b) forming an annular shaped isolation region 15 (FIG. 2) in said substrate that at least encompasses said subcollector region;
   (c) depositing an epitaxial layer 16, (FIG. 3) of monocrystalline semiconductor material on said substrate surface;
   (d) forming a silicon dioxide layer 17 (FIG. 4) on said epitaxial layer 16;
   (e) forming a silicon nitride layer 18 (FIG. 4) on said silicon dioxide layer 17;
   (f) opening an annular shaped trench 19 (FIG. 4) in said exposed surface of said substrate, said trench having a depth less than the thickness of said epitaxial layer 16, said annular shaped trench being superimposed over said annular shaped isolation region and including a portion 20 to be utilized in providing collector reach through isolation;
   (g) exposing said substrate to an oxidizing atmosphere to provide recessed silicon dioxide in said annular shaped trench 21 (FIG. 5) and said portion 22 to be utilized in providing collector reach through isolation;
   (h) remove the silicon nitride layer 18 (FIG. 6) formed in step (e) supra;
   (i) implant impurities of a first conductivity type into a predetermined region 24 (FIG. 6) of said epitaxial layer to provide collector reach-through 25;
   (j) form a silicon nitride layer 26 (FIG. 7) over said exposed surface of said substrate;
   (k) open an emitter contact window 27, a base contact window 28 and a collector contact window 29 in said silicon nitride layer and underlying silicon dioxide to expose three regions on said epitaxial layer, said three regions on said epitaxial layer respectively corresponding to said emitter contact region, said base contact region and said collector contact region;
   (l) deposit a metal film 30 (FIG. 8) over the exposed surface of the said substrate;
   (m) utilize the substrate as an anode in an electrolytic cell, whereby the metal film over said emitter contact region, said base contact region and said collector contact region are respectively anodized to form first, second and third metal oxide regions 31, 32, 33 (FIG. 8) on the exposed surface of said substrate;
   (n) remove the unoxidized metal film whereby said first, second and third metal oxide regions remain on the surface of the substrate; and
   (o) additional steps further characterized in that said first metal oxide region is utilized to align the emitter and provide for post emitter ion implantation of the base.

5. In a method for forming a bipolar transistor, as recited in claim 4, wherein the deposited metal film is an aluminum film and the metal oxide is aluminum oxide.

6. In a method for forming a bipolar transistor in a monocrystalline semiconductor, said method including the following steps:
   (a) forming a subcollector region 13 (FIG. 1) of a first conductivity type in a monocrystalline semiconductor substrate 10 of a second conductivity type;
   (b) forming an annular shaped isolation region 15 (FIG. 2) in said substrate that at least encompasses said subcollector region;
   (c) depositing an epitaxial layer 16 (FIG. 3) of monocrystalline semiconductor material on said substrate surface;
   (d) forming a silicon dioxide layer 17 (FIG. 4) on said epitaxial layer 16;
   (e) forming a silicon nitride layer 18 (FIG. 4) on said silicon dioxide layer 17;
   (f) opening an annular shaped trench 19 (FIG. 4) in said exposed surface of said substrate, said trench having a depth less than the thickness of said epitaxial layer 16, said annular shaped trench being superimposed over said annular shaped isolation region and including a portion 20 to be utilized in providing collector reach through isolation;
   (g) exposing said substrate to an oxidizing atmosphere to provide recessed silicon dioxide in said annular shaped trench 21 (FIG. 5) and said portion 22 to be utilized in providing collector reach through isolation;
   (h) remove the silicon nitride layer 18 (FIG. 6) formed in step (e) supra;
   (i) implant impurities of a first conductivity type into a predetermined region 24 (FIG. 6) of said epitaxial layer to provide collector reach through 25;
   (j) form a silicon nitride layer 26 (FIG. 7) over said exposed surface of said substrate;
   (k) open an emitter contact window 27, a base contact window 28 and a collector contact window 29 in said silicon nitride layer and underlying silicon dioxide to expose three regions on said epitaxial layer, said three regions on said epitaxial layer respectively corresponding to said emitter contact region, said base contact region and said collector contact region;
   (l) deposit a metal film 30 (FIG. 8) over the exposed surface of the said substrate;
   (m) utilize the substrate as an anode in an electrolytic cell, whereby the metal film over said emitter contact region, said base contact region and said collector contact region are respectively anodized to form first, second and third metal oxide regions 31, 32, 33 (FIG. 8) on the exposed surface of said substrate;
   (n) remove the unoxidized metal film whereby said first, second and third metal oxide regions remain on the surface of the substrate;
   (o) utilizing photolithographic techniques and the metal oxide regions to provide a block-out mask and introduce impurities of a second conductivity type into exposed substrate regions to form the extrinsic base region 36 (FIG. 9) of the bipolar transistor;
   (p) remove the metal oxide regions 31, 32 and 33 (FIG. 10);
   (g) utilizing photolithographic techniques to provide a block-out mask and introduce impurities of a second conductivity type into exposed substrate regions to form the base contact region 39 (FIG. 10);

(r) utilizing photolithographic techniques to provide a block-out mask and introduce impurities of a first conductivity type into exposed substrate regions to form the emitter region 43 and collector contact region 44 (FIG. 11); and (s) utilizing photolithographic techniques to provide a block-out mask and ion implant impurities of second conductivity type beneath said emitter region 43 to provide the intrinsic base region 45 (FIG. 12).

7. In a method for forming a bipolar transistor, as recited in claim 6, wherein in step (o) the second conductivity type impurities are introduced into exposed substrate regions by ion implantation.

8. In a method for forming a bipolar transistor, as recited in claim 7, wherein in step (q) the second conductivity type impurities are introduced into exposed substrate regions by ion implantation.

9. In a method for forming a bipolar transistor as recited in claim 8, wherein in step (r) the first conductivity type impurities are introduced into exposed substrate regions by ion implantation.

10. In a method for forming a bipolar transistor, as recited in either claim 5 or claim 9, wherein the first conductivity type is P-type material and said formed bipolar transistor is a PNP.

* * * * *